US010867665B1

(12) United States Patent
Dubey et al.

(10) Patent No.: US 10,867,665 B1
(45) Date of Patent: Dec. 15, 2020

(54) RESET BEFORE WRITE ARCHITECTURE AND METHOD

(71) Applicant: Synopsys, Inc., Mountain View, CA (US)

(72) Inventors: Prashant Dubey, Greater Noida (IN); Jamil Kawa, Campbell, CA (US); Kritika Aditya, Rohini (IN)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 15/897,120

(22) Filed: Feb. 14, 2018

Related U.S. Application Data

(60) Provisional application No. 62/460,085, filed on Feb. 16, 2017.

(51) Int. Cl.
*G11C 11/419* (2006.01)
*G11C 11/413* (2006.01)
*G11C 7/22* (2006.01)
*G11C 11/412* (2006.01)

(52) U.S. Cl.
CPC ............ *G11C 11/413* (2013.01); *G11C 7/22* (2013.01); *G11C 11/412* (2013.01); *G11C 11/419* (2013.01)

(58) Field of Classification Search
CPC .... G11C 11/412; G11C 11/419; G11C 11/413
See application file for complete search history.

(56) References Cited

U.S. PATENT DOCUMENTS

| | | | | |
|---|---|---|---|---|
| 5,886,930 A * | 3/1999 | Maclellan | ............ | G11C 7/1015 365/189.02 |
| 6,590,818 B1 * | 7/2003 | Liston | ................ | G11C 29/12 365/188 |
| 7,835,175 B2 * | 11/2010 | Wang | ................ | G11C 11/413 365/154 |
| 8,437,204 B2 * | 5/2013 | Yen-Huei | .............. | G11C 11/413 365/154 |
| 9,070,477 B1 * | 6/2015 | Clark | ................ | G11C 11/419 |
| 2009/0059697 A1 * | 3/2009 | Adams | ............... | G11C 29/50 365/201 |
| 2009/0109732 A1 * | 4/2009 | Houston | ............... | G11C 8/14 365/154 |
| 2009/0303776 A1 * | 12/2009 | Mair | ................ | G11C 11/412 365/154 |
| 2010/0091585 A1 * | 4/2010 | Wang | ................ | G11C 11/412 365/189.011 |
| 2010/0315890 A1 * | 12/2010 | Yen-Huei | .............. | G11C 11/413 365/191 |
| 2011/0007580 A1 * | 1/2011 | Houston | ............... | G11C 7/18 365/189.15 |
| 2012/0314486 A1 * | 12/2012 | Yoshimoto | ............ | G11C 11/419 365/156 |
| 2014/0050033 A1 * | 2/2014 | Otto | ..................... | G11C 11/412 365/189.02 |

* cited by examiner

Primary Examiner — Jay W. Radke
(74) Attorney, Agent, or Firm — Nicholson De Vos Webster & Elliott LLP; Judith Szepesi

(57) ABSTRACT

An SRAM bit-cell with independent write and read ports and an architecture utilizing a feedback loop from the read port to the write port of half-selected bit-cells. This guarantees absolute data retention of all SRAM bit-cells not fully selected for write operation across a wide range of supply voltage spanning from the nominal voltage of a process to a sub-threshold range.

12 Claims, 7 Drawing Sheets

US 10,867,665 B1

RESET BEFORE WRITE ARCHITECTURE AND METHOD

RELATED APPLICATION

The present application claims the benefit of U.S. Provisional Application No. 62/460,085, filed on Feb. 16, 2017 and incorporates that application by reference in its entirety.

FIELD

The present invention relates to static random access memory (SRAM) and more particularly to extending low voltage operation range in SRAM.

BACKGROUND

Low voltage operation is a challenge for SRAMs from three perspectives: write ability, stability during read, and stability during extended un-exercised periods (retention). All these aspects of SRAM operation are primarily related to the constitution of the bit-cell. The most common SRAM bit-cell is the six-transistor (6T) bit-cell. An exemplary SRAM bit-cell is shown in FIG. 1. Other variations on the 6T bit-cell in the form of added transistors (8T, 10T) can be used to achieve better write-ability and better stability especially at lower than nominal supply voltages.

In the classical 6T bit-cell shown in FIG. 1, the NMOS pass-gate 110 must overcome the pull-up of storage node 170 by PMOS 130 in order to write "O" on the true side (left side node of the latch of FIG. 1) thus writing a "O" value in the bit-cell. Conversely, the NMOS pass-gate 120 must overcome the pull-up of storage node 180 by PMOS 150 in order to write a "O" in the other side (right side latch node of FIG. 1) to write a stored value of "1" in the cell (a value of "1" stored on storage node 170).

The problem of achieving SRAM cell write-ability is harder at lower supply voltages due to variability in the write pass-gate current strength and the write current's strong dependence on the pass transistor's gate overdrive (gate voltage level in excess of the gate voltage threshold) for power supply values near threshold.

Typically better SRAM cell write-ability is achieved at the expense of lower stability, as the ease of writing translates to the ease of unintended cell-content flipping due to disturbance. Thus if the write-ability is improved the stability is degraded.

This is especially true in the case in bit-interleaved architectures where the row being selected for write operation has unselected column bit-cells on which the pass-gates are open (turned on) and therefore the impacted bit-cells internal nodes are connected to their corresponding bit-lines. Such bit-cells are referred to as half-selected bit-cells.

Solutions exist in the literature on ways to improve the stability of the half-selected bit-cells. However; it is quite difficult to achieve good write-ability of a bit-cell and stability of the same bit-cell when the cell is in a half-selected mode.

BRIEF DESCRIPTION OF THE FIGURES

The present invention is illustrated by way of example, and not by way of limitation, in the figures of the accompanying drawings. The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION

The present application discusses an SRAM bit-cell and an architecture that guarantees 100% write-ability. The architecture utilizes a feedback mechanism from the bit-cell's separate read port to a corresponding write bit-line, ensuring that a half-selected bit-cell has stability of its stored data by having the original stored data written back through its write bit-line. Once the half-selected bit-cell's write bit-line has the same value as the data stored in the half-selected bit-cell, if a write word-line is switched "ON," data on a selected bit-line is written to a selected bit cell (through corresponding pass-gates) while the half-selected bit-cell has the same content as the original stored data written to it from its write bit-line. Thus, no write of new data happens on half-selected bit-cells. Therefore 100% stability is achieved.

Figure 1:
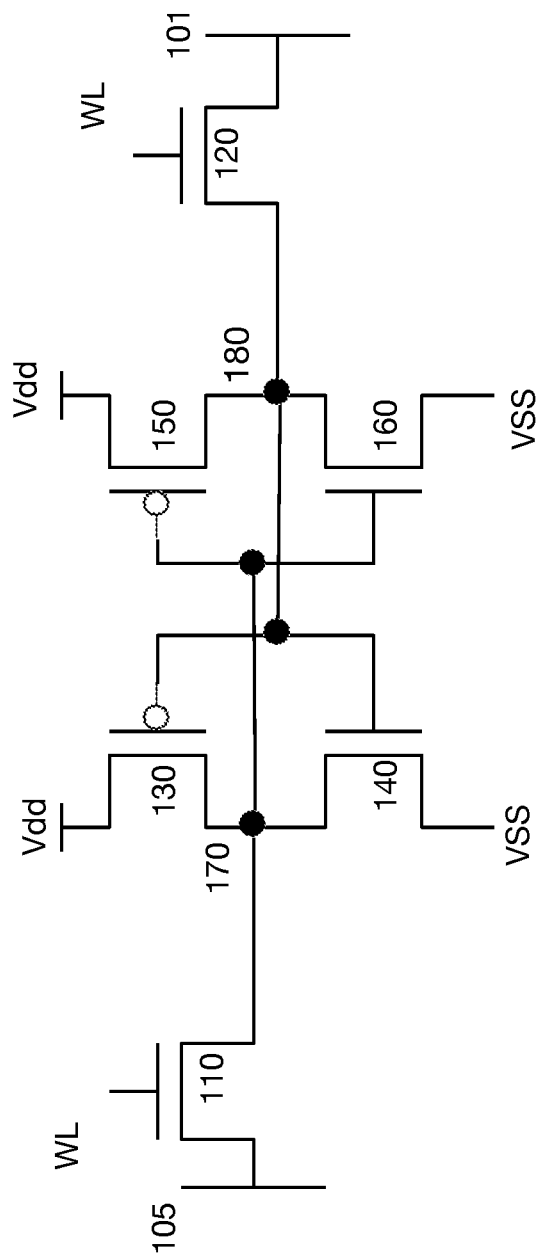
FIG. 1 is a block diagram of a conventional 6T bit-cell SRAM.

FIG. 1 is a classical 6-transistor bit-cell. The storage node 170 is the standard node whose data content defines the SRAM bit-cell content. A "O" is written into the cell by setting the bit-line 105 to "O" and the bit-line-bar 101 to "1" and enabling the word-line WL simultaneously connected to pass gates 110 and 120. For a write "1" operation, the polarity of the data on 105 and 101 are reversed such that "1" is written to storage node 170 and a "O" is written to storage node 180. For a read operation, the bit-line 105 is pre-charged to a "1" and the pass gate 110 is enabled. If a "1" is stored in the cell then the voltage level on 105 is unchanged. If a "0" is stored then a voltage drop on 105 is sensed signaling a "0" cell content. The classical 6-bit transistor cell also contains NMOS 140 and NMOS 160.

Figure 2:
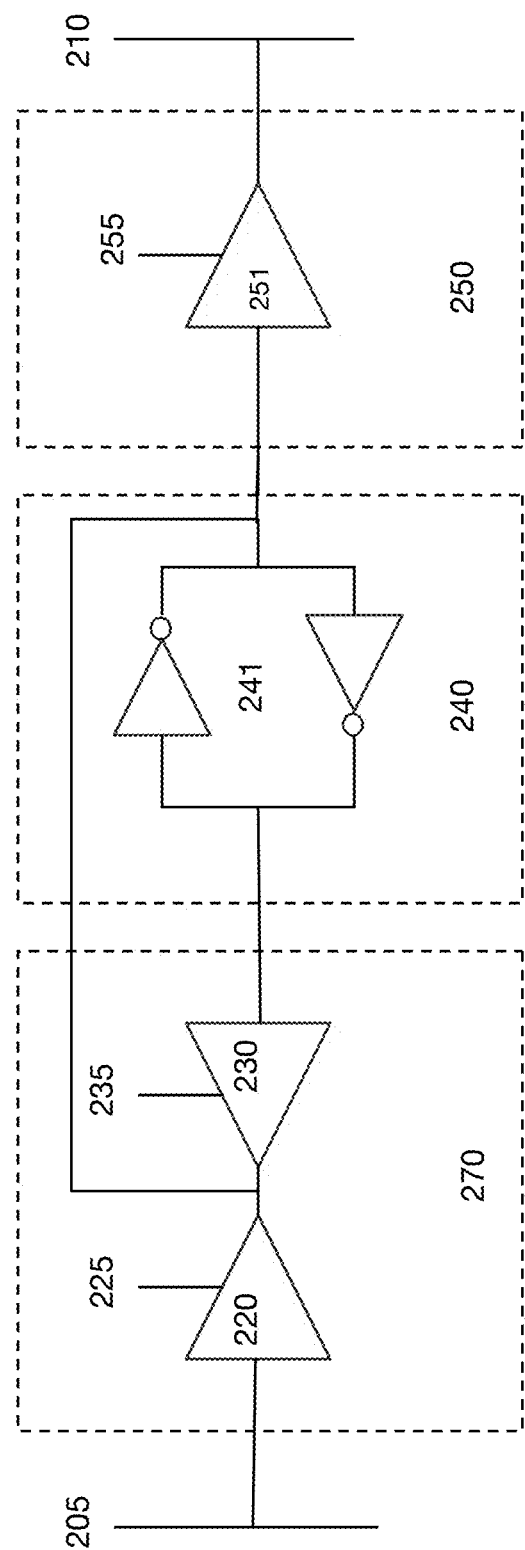
FIG. 2 is a block diagram of one embodiment of a proposed bit-cell incorporating a separate read port.
Figure 3:
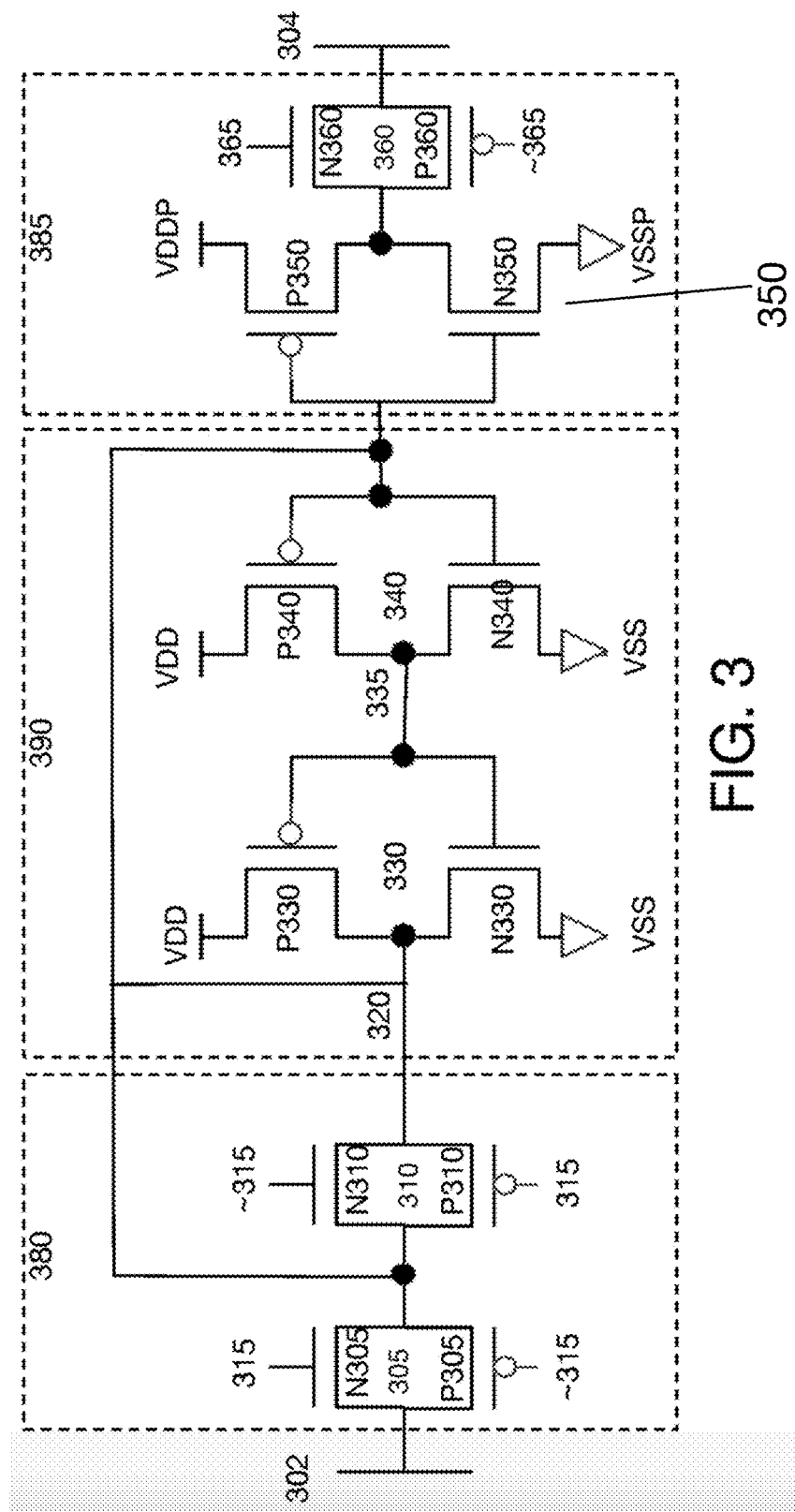
FIG. 3 is a circuit diagram of one embodiment of the bit-cell shown in FIG. 2.

FIG. 2 is a logic gate level representation of one embodiment of the proposed bit-cell and FIG. 3 is a transistor level implementation of the same bit-cell. 205 is the write bit-line, 210 is the read bit-line, and 241 is the memory bit-cell storage portion in area 240. Read buffer 250 has buffer 251 and input line 255 and allows an independent read operation, and write buffer 270, which has buffers 220 and 230 and lines 225 and 235, allows the independent write operation.

As can be seen in FIG. 3, the circuit diagram includes inverter 330 (which includes transistors N330 and P330) and inverter 340 (which includes transistors N340 and P340) that make up the bit-cell storage portion 390.a write buffer 380, and a read buffer 385. The output of inverter 340 is connected to the input of inverter 330. Write buffer 380 contains gate 305 (which includes transistors N305 and P305) with inputs 315 and ~315, and gate 310 (which includes transistors N310 and P310) with inputs ~315 and 315. Read buffer 385 contains inverter 350 (which includes transistors N350 and P350) with connections to VDDP and VSSP and gate 360 (which includes transistors N360 and P360) with inputs 365 and ~365. The output of write buffer 380 is input to inverter 340. The output of inverter 330 is input to inverter 340, to gate 310, and to input of inverter 350.

Figure 4:
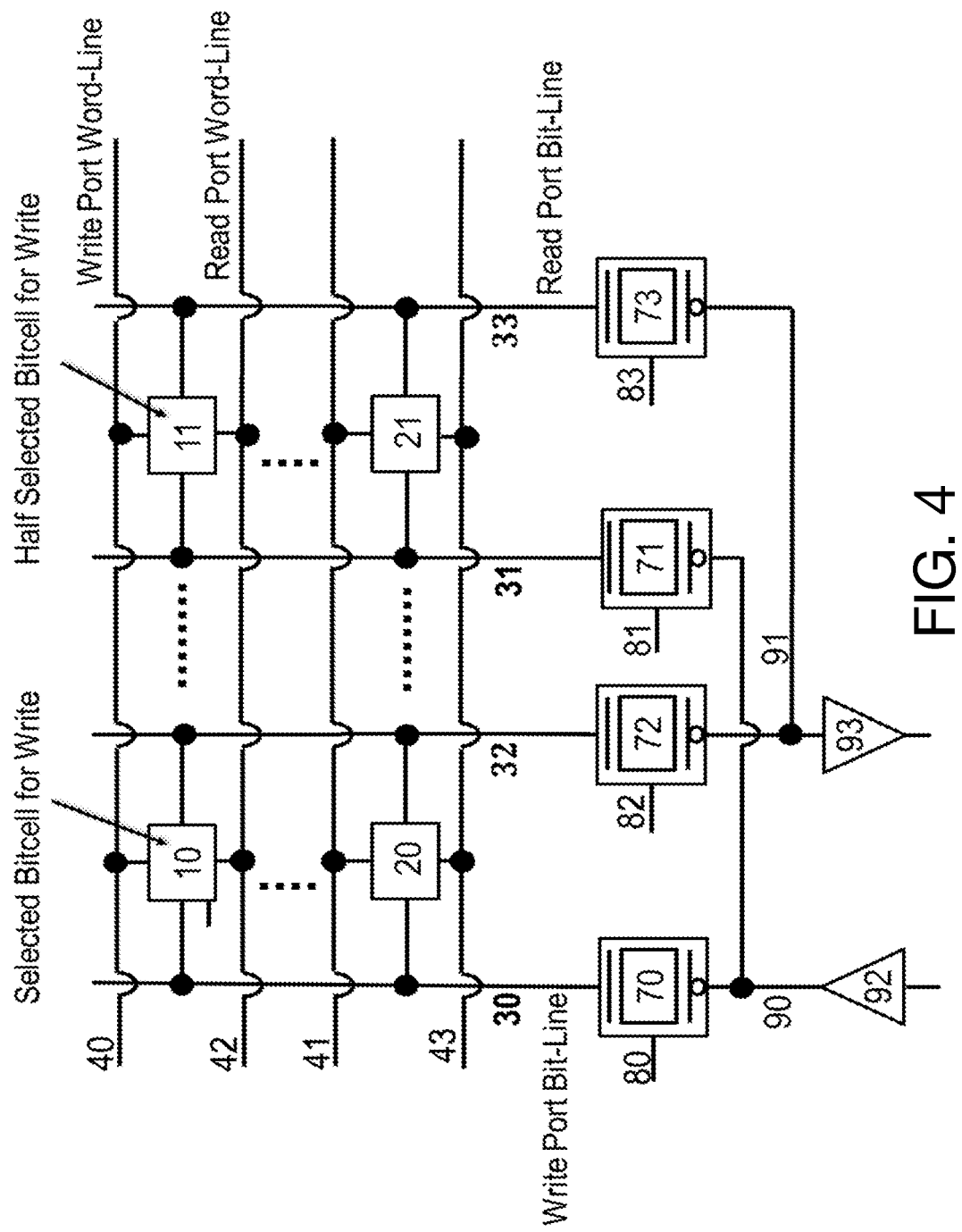
FIG. 4 is one embodiment of a bit-interleaved architecture in a typical memory arrangement where read bit-line is not connected to write bit-line.

FIG. 4 shows one embodiment of a bit-interleaved memory architecture with a read port and a write port. In this structure, the bit-cells 10 and 11 are connected to the write word-line 40 and read word-line 42. Bit-cells 20 to 21 are connected to the local write word-line 41 and the local read word-line 43. Local write bit-line 30 and the local read bit-line 32 constitute one bit-line column and the write bit-line 31 and read bit-line 33 constitute another bit-line column.

Before a write operation to a selected bit-cell is performed, the data on the write bit-line of half-selected bit-cells must be same as the data stored in the storage nodes of those half-selected bit-cells (the node of half-selected bit-cell in FIG. 4). This ensures complete stability of the half-selected bit-cells.

Using FIG. 3 to further illustrate this, in one embodiment, the read port 304 can be used to reset the write-bit-line 302 before a write operation to the level of the node 335 of cell 11, which is the same level on read bit-line 33 after read word-line has been enabled ON, through an external buffer path.

This is achieved by activating the read buffer 385 by switching the read word-line 365 ON. This resets the voltage level of the bit-line 304. Bit-line 304 is coupled to the write bit-line 302, during the initial phase of the write operation. This may be done through connecting the read bit-line 304 to an external read buffer to connect the same to the write bit-line 302.

In the embodiment shown in FIG. 4 a write operation to be performed on bit-cell 10 leaves bit-cell 11 on the same row as half-selected. Write is enabled by activating the write word-line 40. Bit-cells 20 and 21 are the un-selected bit-cells as the corresponding row select word-lines (41, 42, 43 etc.) are inactive.

To ensure the stability of bit-cell 11, which is exposed to the voltage level of write bit-line 31, a reset before write is performed.

This is done by first reading the data O11 from bit-cell 11 and resetting write bit-line 31 with the same value, before activating write word-line 40.

Figure 5:
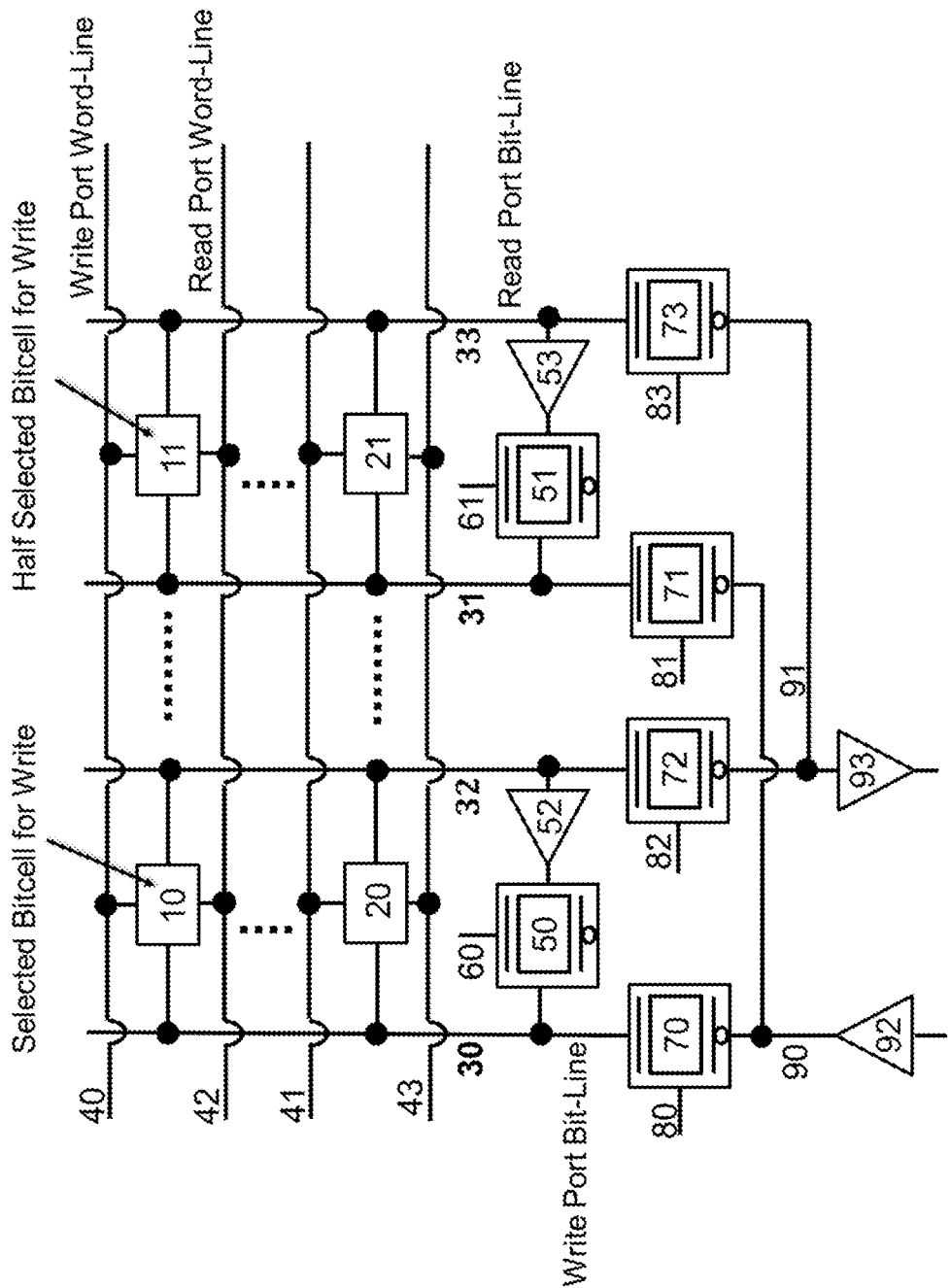
FIG. 5 is one embodiment of a bit-interleaved architecture with read and write bit-lines connected through a feedback loop.

This is illustrated in one embodiment shown in FIG. 5, where the write bit-lines (30, 31 etc.) are connected through switches (50, 51) to read bit-lines (32, 33) respectively.

Figure 6:
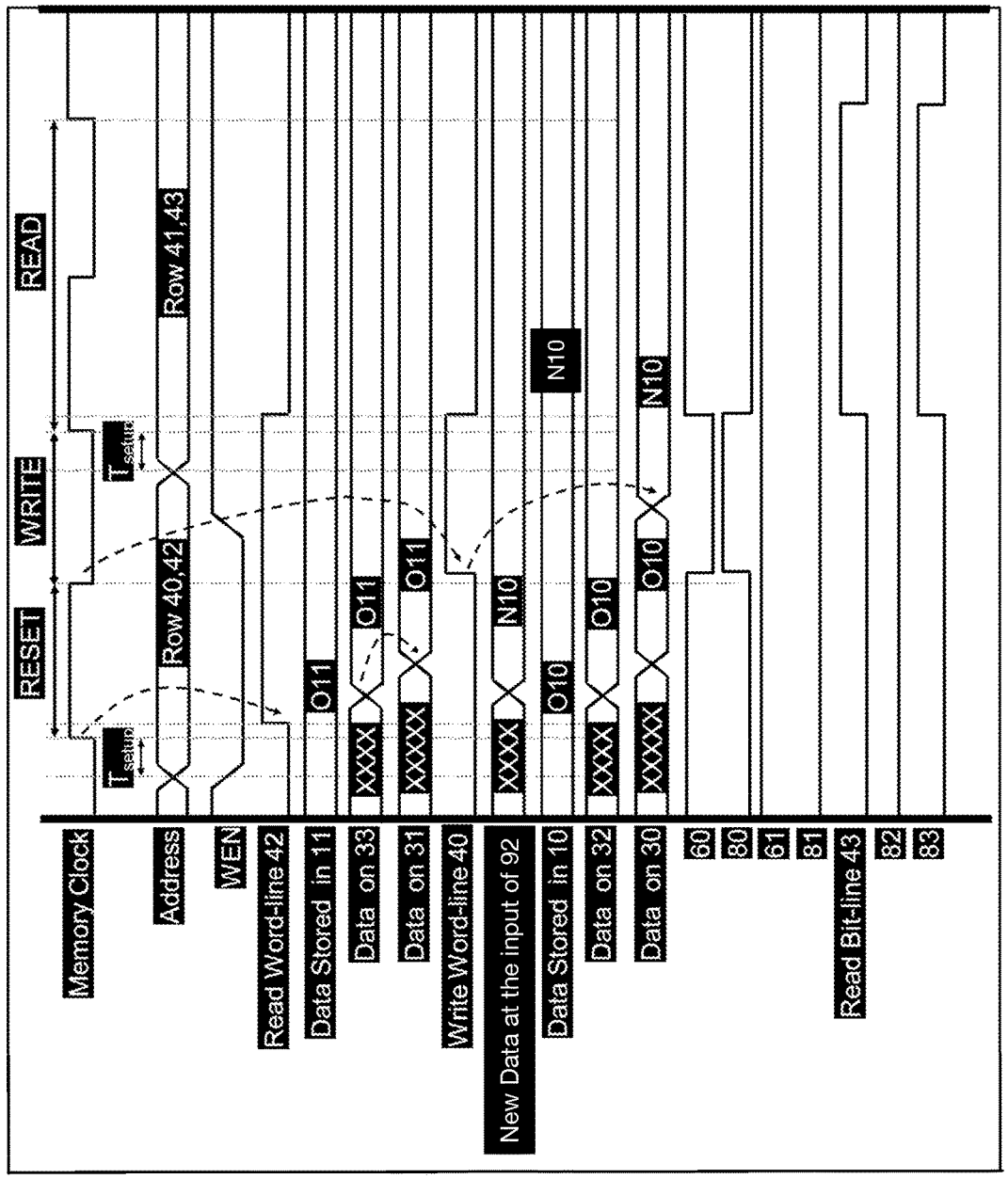
FIG. 6 is the timing diagram for one embodiment of the control generation on the word-lines and select lines to implement, reset before write, write and the read operation.

The control timing for the circuit of FIG. 5 is shown in FIG. 6. In this embodiment, the read word-line 42 is selected before switching the write word-line 40. This resets the bit-lines 30 and 31 to the levels of the storage nodes of the bit-cells 10 and 11, O10 and O11 respectively.

Once the read word-line 42 is active, the read port of the bit-cells 10 and 11 will write their data on the local read bit-lines 32 and 33 respectively.

In one embodiment, read bit-lines 32 and 33 are connected to the read buffers 52 and 53 respectively. The read buffers 52 and 53 in turn are connected to write bit-lines 30 and 31 respectively once the activation signals 60 and 61 are enabled.

In one embodiment, the read buffers 52 and 53 are always active by keeping the signals 60 and 61 high (inverted versions of signal 80 and 81) and connected to the write bit-line 30 and 31. Signals 60 and 61 control switches 50 and 51, respectively, while signals 80 and 81 control the switches 70 and 71 respectively. This ensures that whatever data values are sensed by the read buffers 52 and 53 are transferred to the bit-lines 30 and 31. Signals 82 and 83 control the switches 72 and 73 respectively. Buffer 92 is input to switches 70 and 71 via line 90. Buffer 93 receives input from switches 72 and 73 via line 91.

In one embodiment, the read buffer stays active only for the un-selected local bit-line columns. This is achieved in the preferred embodiment by making the signal 60 and 80 complementary to each other since write will only happen when the reset has finished.

In the control timing illustrated in FIG. 6, it is assumed that the write operation is activated at negative edge of an external clock (memory clock). The read operation is enabled by the WEN (write enable) signal. If the external clock positive edge of the WEN signal goes high, a read operation happens after the clock goes high.

Because the data in the half-selected bit cell is secured by the buffer 53, the voltage level for reads and writes can be reduced without reducing write-ability. This enables low voltage operation in SRAM. It also extends useful life, because data remains stable over a larger range of signals.

Figure 7:
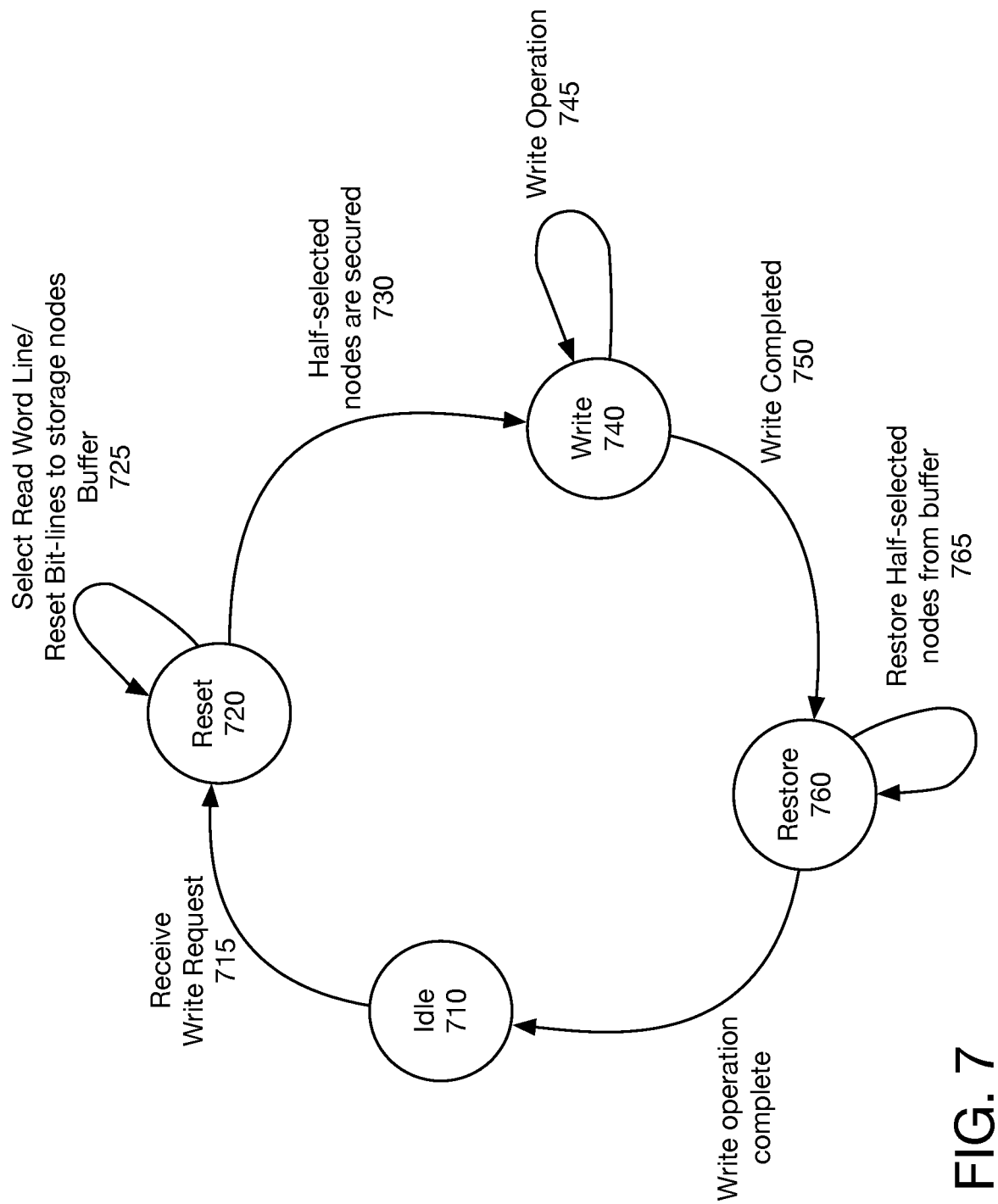
FIG. 7 is a block diagram of one embodiment of a state machine for a write request.

In one embodiment, the system utilizes a state machine that generates the write and read word-line timing sequences. FIG. 7 illustrates one embodiment of the state machine for a write request. The process starts at the idle state 710, when there is data in at least two cells. A write request is received, and this moves the state to a reset state 720 for write-preparation. While in the reset state 720, the half-selected nodes associated with the write request are selected, and read to a buffer 725.

Once the half-selected nodes are secured 730, the state machine moves to the write state 740. The write operation is completed 745, in the standard manner. Once the write is completed, 750, the state machine moves to the restore state 760. In the restore state 760 the system restores data to the half-selected bit cells from the buffer 765. In this way, the half-selected bit cell data is maintained securely.

In the preferred embodiment, during the read operation the read bit-lines are not connected to the write bit-lines and so the reset doesn't happen, since such a reset is not needed as the read ports are separate.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A static random access memory (SRAM) circuit comprising:
    a plurality of bit cells, each bit cell associated with a respective read bit-line and a respective write bit-line;
    a plurality of selectable read ports, each associated with a respective one of the plurality of bit cells;
    a plurality of selectable write ports, each associated with a respective one of the plurality of bit cells;
    one or more half-selected bit cells connected to a selected write-word-line;
    a feedback loop from the selectable read port of a half-selected bit cell of the plurality of bit cells to the write port of the half-selected bit cell, to ensure data retention in the half-selected bit cell;
a multiplexing structure comprising switches, wherein each switch has an input terminal receiving a signal from a respective read bit-line and has an output terminal connected to an output terminal of at least one other switch of the switches without a global read circuit there between, and implementing a bit-interleaved bit cell array, wherein a read bit-line associated with one of the plurality of bit cells is coupled via the switches to other read bit-lines associated with other bit cells of the plurality of bit cells, the switches being selectable in a mutually exclusive manner, wherein one or more of the read bit-lines are selected by the switches; and
un-selected columns of bit cells, each un-selected column corresponding to an un-selected write bit-line, wherein the un-selected write bit-line is connected to write ports of un-selected bit cells and a write port of a half-selected bit-cell in its corresponding column of bit cells.

2. The circuit of claim 1, wherein: the feedback loop is configured to write data from the half-selected bit cell to a write bit-line of the half-selected bit cell, to ensure that a value in the half-selected bit cell is not changed during a write.

3. The circuit of claim 2, wherein the circuit performs resetting of the write bit-line of the half-selected bit cell with the value, before activating a write word-line.

4. A bit-cell circuit comprising:
a first bit-cell to write, read and store data;
a second bit-cell to write, read, and store data;
a first read port connecting the first bit-cell to a first read bit-line;
a first write port associated with the first bit-cell and a first write bit-line connected to the first write port;
a second read port connecting the second bit-cell to a second read bit-line;
a second write port associated with the second bit-cell and a second write bit-line connected to the second write port, wherein when data is written to the first bit-cell, and the second bit-cell is half-selected, the second read port is connected to a feedback mechanism ensuring that the half-selected second bit-cell has stability of the stored data by having original stored data written back to the second write bit-line;
a multiplexing structure comprising switches, wherein each switch has an input terminal receiving a signal from a respective one of the first and second read bit-lines and has an output terminal connected to an output terminal of at least one other switch of the switches without a global read circuit there between, and implementing a bit-interleaved bit cell array, wherein one of the first and second read bit-lines is coupled via the switches to the other one of the first and second read bit-lines, the switches being selectable in a mutually exclusive manner, wherein one or more of the read bit-lines are selected by the switches;
one or more half-selected cells connected to a selected write-word-line;
a set of un-selected write bit lines, each connected to a write port of a half-selected bit cell and to write ports of other un-selected cells in a respective un-selected column of bit-cells; and
a switch controlling the feedback mechanism, the feedback mechanism comprising a connection between the read and the write bit-line of each column.

5. The bit-cell circuit of claim 4, further comprising:
a plurality of independent write ports including the first and second write ports connected to a plurality of bit-cells including the first and second bit-cells; and
a plurality of independent read ports including the first and second read ports connected to the plurality of bit-cells.

6. The bit-cell circuit of claim 4, further comprising:
a common read buffer connected to read ports of multiple bit-cells through the multiplexing structure and a common local read bit-line.

7. The bit-cell circuit of claim 4, wherein the feedback mechanism further comprises:
a buffer connecting one or multiple independent read ports to a write bit line.

8. A method of writing to an SRAM, the SRAM including a plurality of bit cells, each bit cell associated with a respective read bit-line and a respective write bit-line, and a plurality of selectable read ports and a plurality of selectable write ports, each associated with a respective one of the plurality of bit cells, the method comprising:
upon receiving a write request to write data to a first bit cell, identifying a half-selected bit cell, the hall-selected bit cell connected to a selected write-word-line;
buffering data from the half-selected bit cell;
performing the write request; and
restoring the buffered data to the half-selected bit-cell, wherein the buffering utilizes a feedback loop from a read port of the half-selected bit cell to a write port of the half-selected bit cell, to ensure data retention in the half-selected bit cell;
selecting one or more of the read bit-lines using a multiplexing structure that comprises switches, wherein each switch has an input terminal receiving a signal from a respective read bit-line and has an output terminal connected to an output terminal of at least one other switch of the switches without a global read circuit there between, and implements a bit-interleaved bit cell array, a read bit-line associated with one of the plurality of bit cells is coupled via the switches to other read bit-lines associated with other bit cells of the plurality of bit cells, the switches being selectable in a mutually exclusive manner, and one or more of the read bit-lines are selected by the switches;
creating un-selected columns of bit cells, each un-selected column corresponding to an un-selected write bit-line that is connected to write ports of un-selected bit cells and to a write port of a half-selected bit cell; and
providing a switch controlled feedback connection between the read and the write bit-line of each column.

9. The method of claim 8, further comprising:
writing data from the half-selected bit cell to a write bit-line, to ensure that a value of the half-selected it cell is not changed during the performing of the write request.

10. The method of claim 8, wherein the feedback loop is provided by a plurality of independent write ports connected to a plurality of bit-cells and a plurality of independent read ports connected to the plurality of bit-cells.

11. The method of claim 8, wherein the buffering utilizes a buffer within the feedback loop from the read port of the half-selected bit cell to the write port of the half-selected bit cell.

12. The method of claim 8, further comprising coupling multiple read ports of half-selected bit cells to respective write ports of the half-selected bit cells using buffers external to the bit-cells.

* * * * *